(12) United States Patent
Ohashi et al.

(10) Patent No.: US 10,959,330 B2
(45) Date of Patent: Mar. 23, 2021

(54) METAL-CLAD LAMINATE, CIRCUIT BOARD, AND MULTILAYER CIRCUIT BOARD

(71) Applicant: Murata Manufacturing Co., Ltd., Nagaokakyo (JP)

(72) Inventors: Kazuhiko Ohashi, Nagaokakyo (JP); Sunao Fukutake, Nagaokakyo (JP); Takeshi Eda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 77 days.

(21) Appl. No.: 16/526,243

(22) Filed: Jul. 30, 2019

(65) Prior Publication Data
US 2019/0357355 A1  Nov. 21, 2019

Related U.S. Application Data

(63) Continuation of application No. PCT/JP2018/008072, filed on Mar. 2, 2018.

(30) Foreign Application Priority Data

Mar. 6, 2017  (JP) .............................. JP2017-042128

(51) Int. Cl.
*H05K 1/18* (2006.01)
*H05K 1/03* (2006.01)
(Continued)

(52) U.S. Cl.
CPC ............... *H05K 1/036* (2013.01); *B32B 7/12* (2013.01); *B32B 15/082* (2013.01);
(Continued)

(58) Field of Classification Search
CPC ...... H05K 1/036; H05K 3/4623; H05K 3/386; H05K 1/115; H05K 1/181; H05K 1/185;
(Continued)

(56) References Cited

U.S. PATENT DOCUMENTS 10,444,258 B2 * 10/2019  Proksch ............... G01Q 220/00
2014/0308523 A1 * 10/2014  Veerasamy ........... C01B 32/186
428/408

(Continued)

FOREIGN PATENT DOCUMENTS

JP   H10294335 A   11/1998
JP   2003017859 A   1/2003

(Continued)

OTHER PUBLICATIONS

International Search Report issued in PCT/JP2018/008072, dated May 29, 2018.

(Continued)

*Primary Examiner* — Yuriy Semenenko
(74) *Attorney, Agent, or Firm* — Arent Fox LLP

(57) ABSTRACT

A metal-clad laminate that includes a metal foil with low surface roughness and in which the adhesion strength between a liquid crystal polymer film and the metal foil is high, the low transmission loss in a high frequency region is low, and the problems associated with warpage and adhesive leakage are alleviated. The metal-clad laminate includes the liquid crystal polymer film, an adhesive layer, and the metal foil, with the adhesive layer and the metal foil stacked on one surface of the liquid crystal polymer film.

20 Claims, 1 Drawing Sheet

(51) Int. Cl.
- *B32B 7/12* (2006.01)
- *B32B 15/082* (2006.01)
- *B32B 15/092* (2006.01)
- *B32B 15/20* (2006.01)
- *C08J 5/12* (2006.01)
- *C09J 153/02* (2006.01)
- *H05K 1/11* (2006.01)
- *H05K 3/46* (2006.01)

(52) U.S. Cl.
CPC ............ *B32B 15/092* (2013.01); *B32B 15/20* (2013.01); *C08J 5/125* (2013.01); *C09J 153/02* (2013.01); *H05K 1/115* (2013.01); *H05K 1/181* (2013.01); *H05K 1/185* (2013.01); *H05K 3/4626* (2013.01); *B32B 2305/55* (2013.01); *B32B 2307/732* (2013.01); *B32B 2457/08* (2013.01); *C08J 2453/02* (2013.01); *C08J 2463/00* (2013.01); *C08J 2463/02* (2013.01); *C08J 2463/10* (2013.01); *H05K 2201/0141* (2013.01); *H05K 2201/0195* (2013.01)

(58) Field of Classification Search
CPC ......... H05K 3/4626; H05K 2201/0141; H05K 2201/0195; C08J 5/125; C08J 2453/02; C08J 2463/00; C08J 2463/02; C08J 2463/10; B32B 2307/734; B32B 3/266; B32B 15/09; B32B 27/36; B32B 2307/204; B32B 2307/202; B32B 27/20; B32B 7/12; B32B 15/082; B32B 15/092; B32B 15/20; B32B 2305/55; B32B 2307/732; B32B 2457/08; B32B 2307/538; B32B 2307/302; B32B 2264/108; B32B 2307/4026; B32B 2307/206; B32B 2264/104; B32B 2250/02; B32B 2264/102; B32B 2307/748; B32B 2307/714; B32B 2264/10; C09J 125/08; C09J 163/00; C09J 153/02; C09J 153/025

See application file for complete search history.

(56) References Cited

U.S. PATENT DOCUMENTS

| | | | |
|---|---|---|---|
| 2014/0336039 A1* | 11/2014 | Cohen | B01J 37/0217 502/159 |
| 2017/0238428 A1* | 8/2017 | Takahashi | H05K 1/0313 174/251 |
| 2017/0320297 A1* | 11/2017 | Bennison | B32B 27/18 |
| 2018/0134025 A1 | 5/2018 | Nakashima et al. | |
| 2020/0037443 A1* | 1/2020 | Matsuda | H05K 3/4038 |
| 2020/0062877 A1* | 2/2020 | Knopf | C08F 220/56 |
| 2020/0205286 A1* | 6/2020 | Takahashi | H05K 3/46 |
| 2020/0207953 A1* | 7/2020 | Aoki | B32B 25/08 |
| 2020/0375030 A1* | 11/2020 | Nakashima | C08J 5/18 |

FOREIGN PATENT DOCUMENTS

| | | |
|---|---|---|
| WO | 2014147903 A1 | 9/2014 |
| WO | 2016170779 A1 | 10/2016 |
| WO | 2017029917 A1 | 2/2017 |

OTHER PUBLICATIONS

Written Opinion of the International Searching Authority issued in PCT/JP2018/008072, dated May 29, 2018.

\* cited by examiner

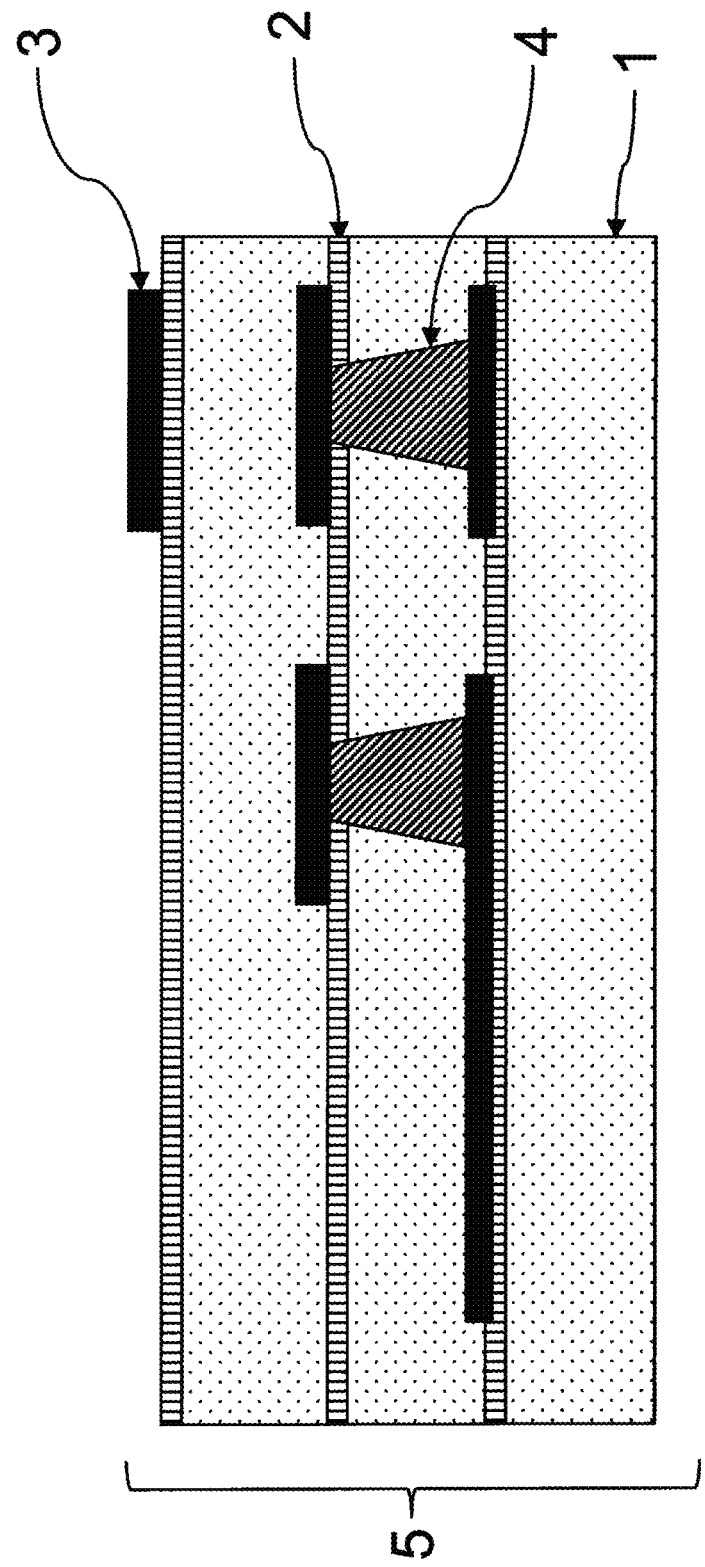

METAL-CLAD LAMINATE, CIRCUIT BOARD, AND MULTILAYER CIRCUIT BOARD

CROSS REFERENCE TO RELATED APPLICATIONS

The present application is a continuation of PCT/JP2018/008072 filed Mar. 2, 2018, which claims priority to Japanese Patent Application No. 2017-042128, filed Mar. 6, 2017, the entire contents of each of which are incorporated herein by reference.

TECHNICAL FIELD

The present invention relates to a metal-clad laminate that prevents warpage and adhesive leakage and also to a circuit board including the metal-clad laminate and a circuit formed in the metal-clad laminate.

BACKGROUND

In recent years, there has been a need to downsize electronics. Accordingly, flexible circuit boards that are light in weight and bendable have come to be used as circuit boards instead of rigid circuit boards. To deal with increases in information communication volume and high-speed communication, there has also been a need for multilayer circuit boards and circuit boards in which the low transmission loss in a high frequency region is low.

In the related art, a prepreg made by impregnating a glass cloth or the like with a thermosetting resin, such as an epoxy resin, is used as an insulating substrate for circuit boards. Such an insulating substrate is rigid, and it is difficult to thin the insulating substrate. There is also a problem of variations in permittivity caused by the cloth. Thus, a flexible polyimide film having good dielectric characteristics has been put to practical use as an insulating substrate. However, since polyimides also absorb water, multilayering of circuit boards including a polyimide film causes marked defects. Accordingly, especially in a high frequency region, there is a practical problem in which the transmission loss increases due to a change in relative permittivity and an increase in dielectric dissipation factor which are associated with water absorption of polyimide. Even if circuit boards including a polyimide film are formed into multilayer circuit boards, multilayer circuit boards need to be produced through the steps of adhesive application, stacking, and adhesive curing in multilayering because of the thermosetting properties of polyimides. These many steps lower productivity.

The use of thermoplastic resin films as insulating substrates enables multilayering only through heat-pressing after stacking of circuit boards (e.g., Patent Document 1, identified below), which leads to a significant increase in productivity of multilayer circuit boards. Among thermoplastic resins, liquid crystal polymers have attracted attention as insulating substrates of circuit boards because liquid crystal polymers have good dielectric characteristics due to a rigid main chain and exhibit very low water absorption.

As described above, liquid crystal polymers are thermoplastic polymers. Thus, a metal foil can be directly and thermally pressure-bonded to a liquid crystal polymer film, or can be bonded to a liquid crystal polymer film with an adhesive since an adhesive composition having good dielectric characteristics has been developed (Patent Document 2, identified below).

Patent Document 3 (also identified below) discloses a method for reducing the dielectric loss by bonding a liquid crystal polymer film and a metal foil to each other with an adhesive having better dielectric characteristics than liquid crystal polymers. This method is one of methods for improving the dielectric characteristics of a metal-clad laminate including a liquid crystal polymer film and a metal foil, which are stacked on top of each other. However, this method needs a thick adhesive layer in order to improve the dielectric characteristics and causes a problem in which the adhesive leaks into large areas of vias when circuit boards are stacked and heat-pressed. If the adhesive layer is thin, the adhesive layer has poor ability to fill the unevenness of the metal foil surface to lower adhesion and is unlikely to reduce the stress applied as a result of a difference in thermal expansion in the heating process and a difference in shrinkage in the subsequent cooling process between the liquid crystal polymer film and the metal foil. As a result, cracks may be generated in the adhesive layer.

Patent Document 1: Japanese Unexamined Patent Application Publication No. 2003-17859.

Patent Document 2: Japanese Unexamined Patent Application Publication No. 10-294335.

Patent Document 3: International Publication No. WO 2014/147903.

Accordingly, as described above, various techniques for improving the dielectric characteristics of flexible circuit boards have been developed. However, the requirements for circuit boards have become more stringent in recent years and, especially, as the requirement increases to further reduce the transmission loss in a high frequency region.

In the related art, for example, a metal foil used for a metal-clad laminate undergoes a surface roughening treatment in order to increase peel strength. However, a surface-roughened metal foil has high electric conduction resistance due to the skin effect, which results in large transmission loss in a high frequency region. Moreover, a liquid crystal polymer film is a material that is hardly bonded even to a surface-roughened metal foil, and no example where a profile-free or low-profile metal foil is bonded to a liquid crystal polymer film with a sufficiently high adhesion strength is known.

SUMMARY OF THE INVENTION

In view of the foregoing, an object of the present invention is to provide a metal-clad laminate that includes a metal foil with low surface roughness and in which the adhesion strength between a liquid crystal polymer film and the metal foil is high, the low transmission loss in a high frequency region is low, and the problems associated with warpage and adhesive leakage can be alleviated. Another object of the present invention is to provide a circuit board that includes the metal-clad laminate and a circuit formed in the metal-clad laminate; a multilayer circuit board including the metal-clad laminates having a circuit and stacked on top of each other; and an electronic component including the multilayer circuit board and a mother board.

Accordingly, the disclosure and exemplary embodiments described herein solve the foregoing problems by appropriately controlling the dynamic magnification and the loss tangent of the adhesive layer even when a liquid crystal polymer film and a profile-free or low-profile metal foil are used, and the adhesive layer is thin.

According to a first exemplary embodiment, a metal-clad laminate is provided that includes a liquid crystal polymer film, an adhesive layer, and a metal foil. Moreover, in an exemplary aspect, the adhesive layer and the metal foil are stacked in this order on one surface of the liquid crystal polymer film. Furthermore the adhesive layer has a thickness of 0.5 μm or more and 4.0 μm or less and a dynamic magnification of 1.15 or more. In an additional aspect, the adhesive layer has a loss tangent of 0.16 or less at a strain of 0.06% under periodic strain at 1 Hz. In addition, a surface of the metal foil in contact with the adhesive layer has a substantial roughness height of 0.4 μm or less.

In a refinement of the exemplary aspect of the metal-clad laminate, the adhesive layer has a relative permittivity of 3.0 or less and a dielectric dissipation factor of 0.008 or less.

In another refinement of the exemplary aspect of the metal-clad laminate, the adhesive layer contains a main agent and a curable resin, and the main agent is a carboxy group-containing styrene-based elastomer.

In another refinement of the exemplary aspect of the metal-clad laminate, the curable resin is an epoxy resin.

In another refinement of the exemplary aspect of the metal-clad laminate, the liquid crystal polymer film has a thickness of 5 μm or more and 130 μm or less.

In another refinement of the exemplary aspect of the metal-clad laminate, the metal foil has a thickness of 5 μm or more and 40 μm or less.

In another exemplary aspect, a circuit board is provided that includes the exemplary metal-clad laminate and a circuit formed in the metal foil of the metal-clad laminate.

In another exemplary aspect, a multilayer circuit board includes two or more of the exemplary circuit boards described above. Moreover, the circuit boards are stacked on top of each other.

In another exemplary aspect, the multilayer circuit board includes a via connecting the circuits.

In another exemplary aspect, the multilayer circuit board further includes an electronic device that is mounted on each circuit.

In another exemplary aspect, and electronic component is provided that includes the exemplary multilayer circuit board described above and a mother board. In this aspect, the multilayer circuit board is mounted on the mother board.

Since the exemplary embodiment of the metal-clad laminate according to the present invention has a liquid crystal polymer film with good dielectric characteristics as an insulating substrate and has a metal foil with low surface roughness, the transmission loss in a high frequency region is low in the metal-clad laminate. Moreover, the use of an adhesive having a particular dynamic magnification increases the adhesion strength between the liquid crystal polymer film and the metal foil even when a profile-free or low-profile metal foil is used. In addition, warpage and adhesive leakage can be alleviated since the thickness of the adhesive layer can be thinned. Moreover, the metal-clad laminate according to the exemplary embodiment can be processed into a multilayer circuit board by an efficient method called a co-lamination process since the liquid crystal polymer forming the insulating substrate is a thermoplastic resin. Therefore, the metal-clad laminate according to the present invention satisfies more stringent requirements for circuit boards, such as high-frequency characteristics, and is thus industrially very useful.

BRIEF DESCRIPTION OF DRAWINGS

FIG. 1 is a cross-sectional schematic view of a multilayer circuit board according to an exemplary embodiment of the present invention.

DETAILED DESCRIPTION

According to the exemplary embodiment, a metal-clad laminate of the present invention includes a liquid crystal polymer film 1 as an insulating substrate. Liquid crystal polymers include thermotropic liquid crystal polymers exhibiting liquid crystallinity in a molten state and lyotropic liquid crystal polymers exhibiting liquid crystallinity in a solution state. Any liquid crystal polymer can be used in the present invention. However, thermotropic liquid crystal polymers are preferably used because they have good thermoplasticity and good dielectric characteristics.

Thermotropic liquid crystal polyesters (hereinafter referred to as "liquid crystal polyesters") among thermotropic liquid crystal polymers refer to, for example, aromatic polyesters exhibiting liquid crystallinity in a molten state and obtained by the reaction between an aromatic hydroxycarboxylic acid, which is an essential monomer, and a monomer, such as an aromatic dicarboxylic acid or an aromatic diol. Typical examples include a I-type liquid crystal polyester [Formula (1) below] synthesized from p-hydroxybenzoic acid (PHB), phthalic acid, and 4,4'-biphenol; a II-type liquid crystal polyester [Formula (2) below] synthesized from PHB and 2,6-hydroxynaphthoic acid; and a III-type liquid crystal polyester [Formula (3) below] synthesized from PHB, terephthalic acid, and ethylene glycol.

[Chem. 1]

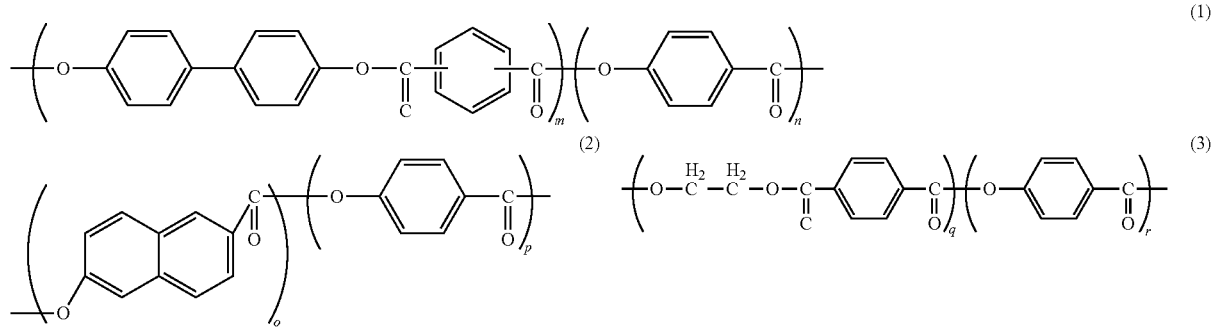

Among the foregoing aromatic polyesters, the I-type liquid crystal polyester and the II-type liquid crystal polyester are preferred, and the II-type liquid crystal polyester is preferable in the exemplary embodiment because of high heat resistance and high hydrolysis resistance. In Formula (1) above, phthalic acid is preferably isophthalic acid.

According to the exemplary aspect, the liquid crystal polymer film is preferably substantially composed only of a liquid crystal polymer from the viewpoint of dielectric characteristics and the like. However, since liquid crystal polymers exhibit strong anisotropy under shearing stress, an inorganic filler for relaxing molecular orientation anisotropy generated in melting liquid crystal polymers may be added as necessary. The addition of such an inorganic filler for orientation relaxation, for example, makes smooth the liquid crystal polymer surface after extrusion and also tends to provide uniform orientation. In addition, a colored inorganic filler may be added in order to control the color tone of the liquid crystal polymer film.

Examples of inorganic fillers for orientation relaxation and colored inorganic fillers that may be added to the liquid crystal polymer film include, but are not limited to, inorganic fillers formed of talc, mica, aluminum oxide, titanium oxide, silicon oxide, silicon nitride, carbon black, and the like. Examples of the shape of the inorganic fillers include, but are not limited to, spherical shape, plate-like shape, rod-like shape, needle-like shape, and irregular shapes. The inorganic fillers preferably have a size of 50 nm or more and 10 µm or less. The size of the inorganic fillers may be the maximum length of each inorganic filler in enlarged photographs, or may be the volume-average particle size or the number-average particle size determined by particle size distribution measurement.

Since inorganic fillers for orientation relaxation and coloring in the liquid crystal polymer film may impair the dielectric characteristics of the substrate film, the proportion of the inorganic fillers in the entire liquid crystal polymer film (the total of the liquid crystal polymer and the fillers) is preferably 20 mass % or less. When the proportion of the inorganic fillers is 20 mass % or less, the liquid crystal polymer film has good dielectric characteristics.

Since liquid crystal polymer molecules have a rigid and long chemical structure, liquid crystal polymer molecules are very easy to orient. An anisotropic film in which liquid crystal polymer molecules are oriented in a particular direction is easy to break in the orientation direction, and it is thus difficult to handle such an anisotropic film. In addition, an anisotropic film has poor dimensional accuracy and has large variations in thermal stress, mechanical strength, relative permittivity, and the like. In the case where a laminate is fabricated by stacking a metal foil on an anisotropic film, warpage occurs in the laminate due to the anisotropy of the film, and the laminate cannot be thus used as an insulating substrate for circuit boards. Therefore, an isotropic liquid crystal polymer film in which molecular orientation is controlled is preferably used in the present invention. Specifically, the ratio of the maximum value to the minimum value of the coefficient of linear thermal expansion in the planar direction is preferably 1.0 or more and 2.5 or less. The ratio is more preferably 2.0 or less, and still more preferably 1.8 or less, and particularly preferably 1.5 or less. In the present invention, the minimum value and the maximum value of the coefficient of linear thermal expansion are the minimum value and the maximum value among the measured values obtained by measuring the coefficient of linear thermal expansion at six points at 30° intervals in the circumferential direction on the plane of the liquid crystal polymer film.

When the liquid crystal polymer film is formed by melt extrusion, a film extruded from an extruder is strongly oriented in the extrusion direction (MD). In the exemplary embodiment of the present invention, the film extruded from the extruder is preferably uniaxially stretched only in the direction (TD) perpendicular to the extrusion direction or biaxially stretched in the MD and TD at a higher stretching ratio in the TD to reduce the anisotropy of liquid crystal polymer molecules, forming an isotropic film. It is noted that the coefficient of linear thermal expansion can be equalized in the TD and the MD by controlling the stretching ratio. In this case, the liquid crystal polymer film is a completely isotropic film, and the ratio of the maximum value to the minimum value of the coefficient of linear thermal expansion in the planar direction is 1.0.

The coefficient of linear thermal expansion of the liquid crystal polymer film according to the present invention in the planar direction is preferably 3 ppm/° C. or more and 30 ppm/° C. or less. As described above, the ratio of the maximum value to the minimum value of the coefficient of linear thermal expansion of the liquid crystal polymer film in the planar direction is preferably 1.0 or more and 2.5 or less. The coefficient of linear thermal expansion can be measured by thermomechanical analysis (TMA). For example, a change ΔL in chuck distance from 100° C. to 50° C. is measured with a thermomechanical analyzer, such as Q400 available from TA Instruments, in accordance with JIS C6481, with a sample shape 4 mm wide, a chuck distance of 15 mm, under a load of 0.1 N. In this measurement, the temperature is increased from normal temperature to 170° C. at a heating rate of 40° C./min, maintained at 170° C. for 1 minute, and decreased from 170° C. to normal temperature at a cooling rate of 10° C./min, during which a change ΔL in chuck distance from 100° C. to 50° C. is measured. The coefficient of linear thermal expansion is then calculated by using a chuck distance L=15 mm and a temperature difference ΔT=50° C.

When the coefficient of linear thermal expansion and the foregoing ratio are controlled in the foregoing ranges, the anisotropy of thermal stress, mechanical strength, and relative permittivity in the planar direction can be reduced assuredly, occurrence of warpage of the laminate can be reduced assuredly, and the dimensional stability is improved, providing a suitable material for electronic circuit boards. For example, the warpage rate of a laminate formed by stacking the metal foil on one surface of the liquid crystal polymer film can be reduced to 10% or less. It is noted that the "warpage rate" can be obtained in accordance with JIS C6481, for example. Specifically, the warpage rate refers to a value obtained as follows: placing the film on a horizontal table in such a manner that the center of the film is in contact with the table and four corners of the film are distant from the table; measuring the distances between the four corners and the table to obtain a maximum distance; and calculating the percentage of the maximum distance with respect to the length of the side of the film. Since a large difference between the coefficient of linear thermal expansion of the liquid crystal polymer film and the coefficient of linear thermal expansion of the metal foil tends to cause warpage of the laminate, the liquid crystal polymer film and the metal foil are preferably controlled so as to have substantially the same coefficient of linear thermal expansion. The coefficient of linear thermal expansion of the liquid crystal polymer film can be controlled by the film extrusion conditions and the film stretching conditions.

The liquid crystal polymer film used in the exemplary embodiment preferably has good dimensional stability. The dimensional stability can be expressed as a dimensional change. Specifically, the dimensional change is obtained in accordance with JIS C6471 as follows: attaching the metal foil to the liquid crystal polymer film; then completely etching away the metal foil by using a ferric chloride solution; performing drying in a circulation oven at 80° C. for 30 minutes after washing with water; and obtaining a change by percentage between the dimension before etching and the dimension after drying. The dimensional change of the exemplary liquid crystal polymer film is preferably −0.1% or more and 0.1% or less.

Liquid crystal polymer films normally have good dielectric characteristics. For example, when the relative permittivity and the dielectric dissipation factor are measured at a frequency of 3 GHz, the relative permittivity of the liquid crystal polymer film used in the present invention is preferably 3.5 or less, and the dielectric dissipation factor is preferably 0.003 or less. The relative permittivity and the dielectric dissipation factor can be measured with, for example, a network analyzer, such as "ENA E5071C" available from Agilent Technologies, and a resonator, such as a split post dielectric resonator available from QWED company at a measurement frequency of 3.18 GHz. The relative permittivity can be calculated from a difference between the resonant frequency of the resonator alone and the resonant frequency of the resonator with a test piece inserted. The dielectric dissipation factor can be calculated from the difference in resonant frequency and a difference between the Q factor of the resonator alone and the Q factor of the resonator with a test piece inserted.

According to an exemplary aspect, the thickness of the liquid crystal polymer film in the present invention is appropriately controlled and preferably 5 μm or more and 130 μm or less. When the thickness is 5 μm or more, a strength sufficient for use as the substrate is ensured. When the thickness is 12 μm or more, the inter-layer insulation is assuredly obtained for use in multilayer circuit boards and the like. The upper limit of the thickness is not limited, but the liquid crystal polymer film with an excessively large thickness increases the weight of an electronic circuit board and may make the drawing process difficult. The thickness is thus preferably 130 μm or less. The thickness is more preferably 12 μm or more, and more preferably 100 μm or less, and still more preferably 50 μm or less.

Moreover, the liquid crystal polymer film used in the present invention can be fabricated by a melt extrusion method, for example. Specifically, a liquid crystal polymer-molten material is directly formed into a film by a method known in the related art, such as a T-die method or an inflation method. However, when the liquid crystal polymer is formed into a film by a T-die method, rigid liquid crystal polymer molecules are oriented in the MD, and the film exhibits anisotropy. In such a case, for example, an anisotropic liquid crystal polymer film is processed such that liquid crystal molecules have the same orientation as in the invention described in Japanese Unexamined Patent Application Publication No. 9-131789. Specifically, an anisotropic liquid crystal polymer film is sandwiched between two support films, such as porous PTFE (polytetrafluoroethylene) resin films, to form a multilayer body. The multilayer body is then uniaxially stretched in the TD at a temperature equal to or higher than the melting point of the liquid crystal polymer or biaxially stretched in both the MD and TD at a higher stretching ratio in the TD to reduce anisotropy. The stretched multilayer body is then cooled, and the stacked support films are peeled off.

In the exemplary embodiment of the present invention, the liquid crystal polymer film is coated with an adhesive 2. However, the reactivity between the liquid crystal polymer film 1 and the adhesive 2 is normally said to be low. To ensure adhesion, a surface of the liquid crystal polymer film to be coated with the adhesive may be roughened by, for example, a plasma treatment, a corona discharge treatment, an UV irradiation treatment, an alkaline solution treatment, or a sandblast treatment, or the number of functional groups contributing to adhesion may be increased. It should be appreciated that roughening the surface of the liquid crystal polymer film does not affect high-frequency characteristics.

The components in the adhesive layer used in the present invention are appropriately selected according to exemplary aspects. The adhesive layer preferably contains a main agent and a curable resin, and preferably contains a carboxy group-containing styrene-based elastomer as a main agent from the viewpoint of dielectric characteristics. The carboxy group-containing styrene-based elastomer refers to an elastomer obtained by modifying, with an unsaturated carboxylic acid, a copolymer having, as a main body, block and random structures composed of an aromatic vinyl compound and a conjugated diene compound, and a hydrogenated product of the copolymer. Examples of the aromatic vinyl compound include styrene, t-butylstyrenes, such as p-t-butylstyrene, α-methylstyrene, p-methylstyrene, divinylbenzene, 1,1-diphenylstyrene, N,N-diethyl-p-aminoethylstyrene, and vinyltoluene. The conjugated diene compound is any conjugated diene compound that can impart rubber elasticity to polystyrene. Examples of the conjugated diene compound include butadiene, isoprene, 1,3-pentadiene, and 2,3-dimethyl-1,3-butadiene.

The modification of a styrene-based elastomer with an unsaturated carboxylic acid can be performed by, for example, copolymerizing the styrene-based elastomer with the unsaturated carboxylic acid during polymerization for forming the styrene-based elastomer. Alternatively, the modification can be performed by heating and mixing the styrene-based elastomer and the unsaturated carboxylic acid in the presence of an organic peroxide. Examples of the unsaturated carboxylic acid include acrylic acid, methacrylic acid, maleic acid, itaconic acid, fumaric acid, maleic anhydride, itaconic anhydride, and fumaric anhydride. The amount of the unsaturated carboxylic acid used for modification is normally about 0.1 mass % or more and 10 mass % or less relative to the entire carboxy group-containing styrene-based elastomer.

The acid value of the carboxy group-containing styrene-based elastomer is preferably 0.1 mg KOH/g or more and 20 mg KOH/g or less. If the acid value is less than 0.1 mg KOH/g, the adhesive composition is not cured well, which may result in a failure of favorable adhesion and heat resistance. If the acid value is more than 20 mg KOH/g, the adhesion strength and the dielectric characteristics may be degraded. The acid value is more preferably 0.5 mg KOH/g or more, still more preferably 1.0 mg KOH/g or more, and more preferably 18 mg KOH/g or less, and more preferably 15 mg KOH/g or less.

The molecular weight of the carboxy group-containing styrene-based elastomer is controlled appropriately. For example, the weight-average molecular weight is preferably 10,000 or more and 500,000 or less. When the weight-average molecular weight is in the range of 10,000 or more and 500,000 or less, the adhesive layer can exhibit good adhesion and good dielectric characteristics. The weight-average molecular weight is more preferably 30,000 or more, and still more preferably 50,000 or more, and more preferably 300,000 or less, and still more preferably 200,000 or less. The weight-average molecular weight in the present invention refers to the molecular weight determined by gel permeation chromatography on a polystyrene basis.

Examples of the styrene-based elastomer for forming the carboxy group-containing styrene-based elastomer include a styrene-butadiene block copolymer, a styrene-ethylenepropylene block copolymer, a styrene-butadiene-styrene block copolymer, a styrene-isoprene-styrene block copolymer, a styrene-ethylenebutylene-styrene block copolymer, and a styrene-ethylenepropylene-styrene block copolymer. Among these copolymers, a styrene-ethylenebutylene-styrene block copolymer and a styrene-ethylenepropylene-styrene block copolymer are preferred from the viewpoint of adhesion and dielectric characteristics. The mass ratio of styrene/ethylenebutylene in the styrene-ethylenebutylene-styrene block copolymer, and the mass ratio of styrene/ethylenepropylene in the styrene-ethylenepropylene-styrene block copolymer is preferably 20/80 to 50/50. If the mass ratio of styrene is less than 20%, the adhesion is not satisfactory. If the mass ratio of styrene is more than 50%, the adhesive layer is hard, and the problems associated with substrate warpage and the like may arise after adhesive curing.

The curable resin is appropriately selected, and preferably an epoxy resin. The epoxy resin used in the present invention is preferably an epoxy resin having two or more epoxy groups per molecule in order to form a crosslinked structure in the reaction between the epoxy resin and the carboxy group-containing styrene-based elastomer and provide high heat resistance. If an epoxy resin having one epoxy group is used, the degree of crosslinking between the epoxy resin and the carboxy group-containing styrene-based elastomer is low, which may not provide sufficient heat resistance. In addition, the dynamic magnification required for good adhesion may not be obtained in the case of a thin adhesive layer. Since higher strain dependency or higher frequency dependency leads to better adhesion, the intermediate backbone is preferably a rigid backbone, such as an aromatic backbone, rather than an aliphatic backbone.

The storage elastic modulus of an adhesive layer of a common metal-clad laminate is normally 1000 MPa or more, and the storage elastic modulus of an adhesive layer with low storage elastic modulus is 100 MPa or more. In particular, the optimization of the viscoelastic characteristics in a low elasticity range has not been studied so far. According to an exemplary aspect of the invention, a practically sufficient adhesion strength is obtained by appropriately controlling the dynamic magnification and the loss tangent of an adhesive layer even when a liquid crystal polymer film and a profile-free or low-profile metal foil are used for high-frequency characteristics, and an adhesive layer is thinned for reducing adhesive leakage. Specifically, the dynamic magnification of the adhesive layer is 1.15 or more, and the loss tangent is 0.16 or less at a strain of 0.06% under periodic strain at 1 Hz. The dynamic magnification is obtained from Formula (I) below.

Dynamic magnification=(storage elastic modulus at strain of 2% under periodic strain at 100 Hz)/(storage elastic modulus at strain of 2% under periodic strain at 1 Hz)     (I)

The storage elastic modulus of the adhesive layer can be measured with a rheometer after an adhesive is formed into a film and thermally cured. Examples of the rheometer include a rotational rheometer "Discovery HR-2" available from TA instruments. The viscoelasticity is normally measured under the measurement conditions of a frequency of 1 Hz or more and 10 Hz or less and a strain of 0.06% or more and 0.1% or less. This is because the measurement conditions in these ranges provide stable measured values and high correlation between storage elastic modulus and shear hardness. When the adhesive layer has a normal thickness, such as 20 μm or more, and the loss tangent (tan δ) at a strain of 0.06 under periodic strain at 1 Hz is in the range of 0.08 or more and 0.16 or less, good adhesion can be obtained. The loss tangent (tan δ) is a measure of the elasticity and viscosity of a material and expressed as a ratio of the loss elastic modulus to the storage elastic modulus at a strain of 0.06 under periodic strain at 1 Hz in the present invention. In general, the loss tangent tends to decrease as the curing density of the adhesive increases and tends to increase as the curing density decreases. When the loss tangent is in the foregoing range, good adhesion can be obtained. This is in good agreement with the commonly discussed phenomenon that satisfactory adhesion cannot be obtained unless the adhesive is cured, and satisfactory adhesion cannot be obtained if the adhesive is excessively cured.

However, the inventors of the present invention have found that, if the adhesive layer has a thickness as thin as 4.0 μm or less, good adhesion may not be obtained even with a loss tangent in the forgoing range. The reason for this is assumed, from viscoelastic models of peeling phenomena, that if the adhesive layer has a thickness of 4.0 μm or less, the ratio of the displacement of the adhesive layer to the thickness of the adhesive layer is larger than that for a thick adhesive layer, and the adhesive layer is peeled with an amount of strain larger than the amount of strain normally measured. Moreover, the displacement rate is larger than that for a thick adhesive layer. The analysis of the displacement rate using divided small cells as in the finite element method easily reveals that the displacement rate is not constant. Specifically, the inventors of the present invention have found that, in the case where the adhesive layer is very thin, such as 4.0 μm thick or less, good adhesion can be obtained by using an adhesive whose elastic modulus increases as the displacement rate increases under the condition of a relatively large amount of strain, that is, by using an adhesive whose elastic modulus has high rate dependency (frequency dependency) under high strain.

The reason for measuring the storage elastic modulus under periodic strain at 100 Hz and 1 Hz in order to calculate dynamic magnification is because stable measured values are obtained at a frequency in this range. If the storage elastic modulus is measured under the condition of 1 Hz or less, the creep phenomenon (gradual deformation) occurs in the material, and the storage elastic modulus may be smaller than the original storage modulus of the material depending on the measurement time, or cannot be measured depending on the device because of excessively small frequency. If the storage elastic modulus is measured under the condition of 100 Hz or more, the frequency may overlap the resonant frequencies of the material and the measuring device, and stable measured values may not be obtained. In general, when the storage elastic modulus is measured by using the same sample, the storage elastic modulus increases with increasing frequency up to resonant frequency, and the storage elastic modulus decreases with increasing frequency above resonant frequency. The resonant frequency depends on material. The resonant frequency of the adhesive composition of the present invention is in the range from 200 to 500 Hz, and the resonant frequency of the device is also close to 300 Hz. Thus, a frequency of 100 Hz is employed in order to obtain stable measured values.

The viscoelasticity is normally measured at a strain in the range of 0.06% or more and 0.1% or less. In an exemplary aspect of the present invention, however, the measured value in a high strain state, such as a strain of 2%, is used to calculate dynamic magnification. This is because, with the measurement at 180° peel strength taken into consideration as a peeling mode, the adhesive layer when peeled off is assumed to undergo displacement of more than 0.06% to 0.1% in the viscoelastic model. Polymer materials such as adhesives have strain dependency as represented by the Payne effect. As the strain increases, the interparticle distance of fillers and the intermolecular distance of polymers and curing agents increase, and thus the attractive force such as the van der Waals force decreases, which leads to a reduced storage elastic modulus. Therefore, in the measurement of the storage elastic modulus of a thin adhesive layer as in the present invention, a storage elastic modulus that is reduced in a high strain state due to strain dependency is used because it is phenomenologically close to the storage elastic modulus of the adhesive layer displaced during peeling.

As described above, the correlation between strain and adhesion increases with increasing strain for a thin adhesive layer. However, a large strain places a large load on a device, such as a rotational rheometer, and the strain may be automatically corrected so as to reduce the load during measurement for device safety. Thus, the measured values at a strain of 2% are employed in order to obtain stable measured values.

To obtain good adhesion as described above, an adhesive whose storage elastic modulus increases as the displacement rate increases under the condition of a relatively large amount of strain, that is, an adhesive whose storage elastic modulus has high rate dependency (frequency dependency) under high strain, is preferably used. In the present invention, the dynamic magnification is obtained in order to show this frequency dependency. When the dynamic magnification is 1.15 or more, good adhesion can be obtained. The dynamic magnification is preferably 1.30 or more, and more preferably 1.50 or more. Since an excessively large dynamic magnification results in a large loss tangent, the dynamic magnification is preferably 3.00 or less. The loss tangent is preferably 0.08 or more and 0.16 or less at a strain of 0.06% under periodic strain at 1 Hz. If the loss tangent is less than 0.08, the curing density of the adhesive is excessively high, and good adhesion may not be obtained. If the loss tangent is more than 0.16, the curing density of the adhesive layer is low, and good close adhesion may not be obtained. Thus, the dynamic magnification is preferably controlled such that the loss tangent is 0.16 or less.

The dynamic magnification can be increased by increasing the steric hindrance of the molecular backbone of the adhesive composition. Specifically, the dynamic magnification can be appropriately controlled by increasing the styrene content of the carboxy group-containing styrene-based elastomer, using an epoxy resin having an intermediate backbone with large steric hindrance, such as an aromatic backbone, or using a suitable amount of filler with a small particle size.

The thickness of the adhesive layer is preferably 0.5 µm or more and 4.0 µm or less. When the thickness of the adhesive layer is 0.5 µm or more, the adhesive layer has a great ability to fill the raw foil-originated unevenness of the metal foil surface and exerts satisfactory adhesion. In addition, the stress caused as a result of a difference in thermal expansion in the heating process and a difference in shrinkage in the subsequent cooling process between the liquid crystal polymer film and the metal foil can be relaxed, and generation of cracks in the adhesive layer can be sufficiently reduced. When the thickness of the adhesive layer is 4.0 µm or less, for example, the leakage of adhesive components into vias can be reduced during laminate pressing, and connection reliability can be ensured, and the stress caused as a result of expansion and shrinkage of the adhesive layer can be reduced. Thus, for example, the warpage of the metal-clad laminate can be suppressed.

The amount of adhesive leakage is determined by making a through-hole with a diameter 1.0 mm in a metal-clad laminate by using a YAG laser; then performing heat-pressing at 270° C. and 4 MPa for 15 minutes; removing the metal foil by etching; and measuring the maximum distance, from the through-hole wall surface, of the adhesive leaked into the through-hole in the surface from which the metal foil has been removed, by using a digital microscope. The amount of adhesive leakage is preferably 50 µm or less. If the amount of adhesive leakage is more than 50 µm, the adhesive leakage may have an adverse effect on via connection reliability. The amount of adhesive leakage is more preferably 30 µm or less.

The thickness of the adhesive layer is more preferably 1.0 µm or more and less than 3.0 µm. If the thickness is in the foregoing range, the adhesion strength between the liquid crystal polymer film and the metal foil is high, which can more effectively reduce the amount of adhesive leakage. The thickness of the adhesive layer can be measured by a method known in the related art. For example, the thickness can be accurately calculated from the weight of the adhesive layer and the specific gravity of the adhesive as described below in Examples. Alternatively, the thickness may be obtained by a common method involving magnified observation of the cross section of the adhesive layer. Specifically, first, a 5 mm square sample including an adhesive layer is cut out and embedded in a room temperature curing epoxy resin, and the resin is cured at 23° C. for 24 hours to form a cylindrical epoxy resin block 10 mm in diameter and 10 mm in thickness including the adhesive layer. The block is cut perpendicular to the adhesive layer plane, and the exposed adhesive layer cross section is precisely polished in an ion milling system. The magnified observation of the precisely polished adhesive layer cross section is carried out by using an electron microscope, the thickness of the adhesive layer is measured at least three points in the magnified image, and the mean can be taken as a thickness.

The adhesive layer preferably has good dielectric characteristics. Since a liquid crystal polymer film has good dielectric characteristics, the use of an adhesive having good dielectric characteristics can maintain favorable the dielectric characteristics of the entire metal-clad laminate or can improve the dielectric characteristics of the entire metal-clad laminate even though the adhesive layer is thin in the present invention. Specifically, preferably, the relative permittivity of the adhesive layer is 3.0 or less, and the dielectric dissipation factor is 0.008 or less. More preferably, the relative permittivity is 2.5 or less, and the dielectric dissipation factor is 0.007 or less. When the relative permittivity and the dielectric dissipation factor are in the foregoing ranges, the dielectric loss especially in a high frequency region is low.

The adhesive is preferably soluble in a solvent. Since the liquid crystal polymer film is coated with the adhesive having a thickness of 4.0 µm or less, the adhesive is preferably soluble in a general-purpose solvent, such as toluene or MEK, that is, preferably has a solubility of, for example, 10 wt % or more at normal temperature.

Moreover, the metal foil in the metal-clad laminate according to an exemplary embodiment of the present invention is made of any electrically conductive material.

Examples of the material include copper, aluminum, nickel, tin, and alloys thereof. A copper foil is preferred from the viewpoint of electrical conductivity, chemical stability, costs, and the like. The surface of the metal foil preferably undergoes an anti-corrosion treatment with Zn, Ni, Co, Cr, or the like.

In order for the circuit board including the metal-clad laminate to exhibit good high-frequency characteristics, a surface of the metal foil to be in contact with the adhesive layer preferably has the lowest possible surface roughness. A metal foil with a rough surface has high electric conduction resistance due to the skin effect, which results in large transmission loss in a high frequency region. Thus, a profile-free or low-profile metal foil is used in the present invention.

In the related art, Rzjis (JIS B0601-2001) is used as a measure of the roughness of a metal foil, and the sampling length (measuring range) for Rzjis is normally 100 µm or more. However, since the metal foil used in the exemplary embodiment of the present invention is a profile-free or low-profile metal foil, the Rzjis measured with such a sampling length is affected by raw foil undulation. To exclude the influence of raw foil undulation and express the roughness of intended fine unevenness, the "substantial roughness height" measured on the basis of Rzjis with a sampling length of 10 µm is used as a measure of the roughness of the metal foil in the present invention. Since the length of one undulation of the metal foil is normally 50 µm or more, the influence of undulation can be eliminated by setting the sampling length at 10 µm.

Moreover, the substantial roughness height of the metal foil used in the present invention can be 0.4 µm or less, and preferably 0.3 µm or less. When the substantial roughness height is 0.4 µm or less, good high-frequency characteristics are obtained. The lower limit of the substantial roughness height is not limited. Since a non-roughened metal foil even has a substantial roughness height of about 0.1 µm or more, the lower limit of the substantial roughness height may be 0.1 µm.

The thickness of the metal foil is appropriately controlled and can be, for example, about 2 µm or more and 70 µm or less. When the thickness of the metal foil is 2 µm or more, the metal foil has enough strength and is unlikely to break or the like in stacking the metal foil on the liquid crystal polymer film. When the thickness is 70 µm or less, fine wiring is possible, and problems in which the laminate or the circuit board is too thick or too heavy can be avoided. The thickness of the metal foil is more preferably 5 µm or more and 40 µm or less.

In the metal-clad laminate according to the present invention, the adhesive layer and the metal foil are stacked in this order on one surface of the liquid crystal polymer film. In other words, the adhesive layer is formed on one surface of the liquid crystal polymer film, and the metal foil is bonded to the adhesive layer. When the adhesive layer and the metal foil are stacked only on one surface of the liquid crystal polymer film, a multilayer circuit board can be efficiently fabricated by forming a circuit in the metal-clad laminate of the present invention, stacking a plurality of the metal-clad laminates after forming a via as necessary, and subjecting the metal-clad laminates to thermal pressure bonding in one operation.

In an exemplary aspect, the metal-clad laminate can be easily fabricated by stacking the metal foil on one surface of the liquid crystal polymer film with the adhesive layer interposed therebetween and then performing heat-pressing. Heat-pressing can be performed by a method known in the related art using, for example, a vacuum press machine, a roll press machine, or a double belt press machine. The heat-press conditions may be appropriately controlled. For example, in the case of using a vacuum press machine, hot-pressing may be performed at a temperature of about 150° C. or higher and 350° C. or lower and a pressure of about 1 MPa or more and 10 MPa or less for about 1 minute or more and 2 hours or less.

Moreover, in the metal-clad laminate according to the present invention, the adhesion between the metal foil and the liquid crystal polymer film is preferably high. Specifically, the adhesion strength expressed as a peel strength (unit: N/mm) is preferably 0.5 N/mm or more when a metal foil pattern formed so as to have a width of 5 mm by etching the metal foil is peeled off in the 180°-direction at a rate of 50 mm/min by using a tensile tester in accordance with JIS C6471.

A portion of the metal foil in the metal-clad laminate according to the present invention is chemically etched with a ferric chloride solution or the like to form a desired circuit pattern, whereby a circuit board is provided. Specifically, the metal-clad laminate according to the present invention includes a liquid crystal polymer film, an adhesive layer, and a circuit layer, wherein the adhesive layer is formed on one surface of the liquid crystal polymer film, and the circuit layer is formed on the adhesive layer. The adhesive layer has a thickness of 0.5 µm or more and 4.0 µm or less. The adhesive layer has a dynamic magnification of 1.15 or more. The adhesive layer has a loss tangent of 0.16 or less at a strain of 0.06% under periodic strain at 1 Hz. A surface of the metal foil in contact with the adhesive layer has a substantial roughness height of 0.4 µm or less. Since the circuit of the circuit board according to the present invention is formed by etching the metal foil of the metal-clad laminate according to the present invention, the description and suitable aspects of the metal-clad laminate according to the present invention are applied to the circuit board according to the present invention.

Of course, an electronic device can be mounted on the circuit pattern of the circuit board according to the present invention. The electronic device is any electronic device that can be mounted on the circuit board. Examples of the electronic device include semiconductor devices alone as well as chip resistors, chip capacitors, and semiconductor packages.

In an exemplary aspect, the multilayer circuit board 5 includes two or more of the circuit boards according to the present invention, and the circuit boards are stacked on top of each other. Specifically, the multilayer circuit board includes two or more circuit boards, and the circuit boards are stacked on top of each other, wherein the circuit board includes a liquid crystal polymer film, an adhesive layer, and a circuit layer, the adhesive layer is formed on one surface of the liquid crystal polymer film, and the circuit layer is formed on the adhesive layer. The adhesive layer has a thickness of 0.5 µm or more and 4.0 µm or less. The adhesive layer has a dynamic magnification of 1.15 or more. The adhesive layer has a loss tangent of 0.16 or less at a strain of 0.06% under periodic strain at 1 Hz. A surface of the metal foil in contact with the adhesive layer has a substantial roughness height of 0.4 µm or less. In the multilayer circuit board, the circuit boards are stacked such that the adhesive layer and the circuit layer in one circuit board are in contact with the liquid crystal polymer film in an adjacent circuit board.

Especially for multilayer circuit boards, a via 4 may be formed by a method known in the related art. The via 4 refers to a hole for electrically connecting both surfaces of the metal-clad laminate or adjacent circuits with the liquid crystal polymer film and the adhesive layer interposed therebetween. For example, for the metal-clad laminate of the present invention, the via refers to a hole formed by irradiating the metal-clad laminate with a laser from the liquid crystal polymer film surface side such that the laser penetrates the liquid crystal polymer film and the adhesive layer but does not penetrate the metal foil. In a broad sense, vias include holes filled with a conductive metal paste or the like, holes with the metal-plated side surface, and metal-plated holes. Examples of the conductive metal paste include, but are not limited to, Sn-containing conductive metal pastes, such as a Cu—Sn-based paste.

The multilayer circuit board 5 can be fabricated efficiently and easily by forming a circuit 3 in a metal foil of the metal-clad laminate according to the present invention, stacking a plurality of the metal-clad laminates after forming a via as necessary, and performing heat-pressing. Specifically, a circuit is formed by, for example, etching a metal foil of a metal-clad laminate having a size corresponding to the size of an intended multilayer circuit board to produce a circuit board including the layers of the intended multilayer circuit board. As necessary, a bottomed hole for connecting circuits between layers is formed with a laser or the like, and a conductive paste is poured into the bottomed hole to form a via. The order of forming the circuit, forming the bottomed hole, and filling the bottomed hole with the conductive paste is not limited. The circuit may be formed after the bottomed hole is formed in the metal-clad laminate and the bottomed hole is filled with the conductive paste, or the bottomed hole may be formed and filled with the conductive paste after the circuit is formed. An electronic device may be mounted on the circuit of each circuit board.

Next, two or more circuit boards are stacked on top of each other and then heat-pressed to provide a multilayer circuit board. The circuit boards are stacked such that the adhesive layer and the circuit layer in one circuit board are in contact with the liquid crystal polymer film in an adjacent circuit board. Since the liquid crystal polymer is a thermoplastic polymer, the liquid crystal polymer film can be directly and thermally pressure-bonded to the circuit surface. Heat-pressing can be performed by a method known in the related art using a vacuum press machine, a roll press machine, a double belt press machine, or the like. The heat-press conditions may be appropriately controlled. For example, in the case of using a vacuum press machine, heat-pressing may be performed at a temperature of about 250° C. or higher and 350° C. or lower and a pressure of about 1 MPa or more and 10 MPa or less for about 1 minute or more and 2 hours or less. The heat-press temperature is preferably below the melting point of the liquid crystal polymer. When the heat-press temperature is below the melting point of the liquid crystal polymer, the characteristics of the liquid crystal polymer films before thermal pressure bonding are certainly maintained by the liquid crystal polymer films in the multilayer circuit board.

In an exemplary aspect, the multilayer circuit board 5 can be further mounted on a mother board to provide an electronic component according to the present invention.

EXAMPLES

The exemplary embodiment of the present invention will be described below in more detail by way of examples, which should not be construed as limiting the present invention. Various modifications are possible without departing from the gist of the present invention, and any of the modifications is within the technical scope of the present invention.

Examples 1 to 5, Comparative Examples 1 to 6: Production of Metal-Clad Laminate, (1) Preparation of Adhesive Composition Adhesive compositions were prepared by mixing an adhesive main agent, a curable resin, and a curing aid at the compositions shown in Tables 1 and 2. The components are specifically described below, and the values in Tables 1 and 2 represent mass parts.

Adhesive main agent 1: Trade name "Tuftec (registered trademark) M1913" (styrene content 30 wt %, acid value 10 mgCH3ONa/g) available from Asahi Kasei Chemicals Corporation Adhesive main agent 2: Trade name "Tuftec M1943" (styrene content 20 wt %, oxidation 10 mgCH3ONa/g) available from Asahi Kasei Chemicals Corporation Adhesive main agent 3: Trade name "Tuftec M1911" (styrene content 30 wt %, oxidation 2 mgCH3ONa/g) available from Asahi Kasei Chemicals Corporation Curable resin 1: Trade name "EPICLON (registered trademark) HP-7200" (cyclopentadiene-type epoxy resin) available from DIC Corporation Curable resin 2: Trade name "EPICLON HP-4700" (naphthalene-type epoxy resin) available from DIC Corporation Curable resin 3: Trade name "EPICLON EXA-4816" (BPA-aliphatic backbone epoxy resin) available from DIC Corporation Curable resin 4: Trade name "EPICLON EXA-4850-150" (BPA-polar group-containing aliphatic backbone epoxy resin) available from DIC Corporation Curing aid 1: Trade name "SPF-30MHE" (submicron silica formed by treating filler surface with epoxysilane coupling agent, d100=3.2 μm) available from Denka Company Limited Curing aid 2: Trade name "PIB-30N" (polyisobutylene) available from NOF Corporation Curing aid 3: Trade name "CUREZOL (registered trademark) 2E4MZ" (imidazole-type epoxy resin curing agent) available from Shikoku Chemicals Corporation

TABLE 1

|  |  | Example 1 | Example 2 | Example 3 | Example 4 | Example 5 |
|---|---|---|---|---|---|---|
| Adhesive main agent | 1 | 100 | 100 |  | 100 | 100 |
|  | 2 |  |  |  |  |  |
|  | 3 |  |  | 100 |  |  |
| Curable resin | 1 | 5 |  |  | 10 |  |
|  | 2 |  |  |  |  | 10 |
|  | 3 |  |  |  |  |  |
|  | 4 |  | 5 | 10 |  |  |
| Curing aid | 1 |  |  |  | 0.2 |  |
|  | 2 |  |  |  |  |  |
|  | 3 | 0.2 | 0.2 | 0.2 | 0.2 | 0.2 |
| Solvent | MEK | 40 | 40 | 40 | 40 | 40 |
|  | Toluene | 360 | 360 | 360 | 360 | 360 |

TABLE 2

|  |  | Comparative Example 1 | Comparative Example 2 | Comparative Example 3 | Comparative Example 4 | Comparative Example 5 | Comparative Example 6 |
|---|---|---|---|---|---|---|---|
| Adhesive main agent | 1 | 100 | 100 | 100 | 100 |  | 100 |
|  | 2 |  |  |  |  | 100 |  |
|  | 3 |  |  |  |  |  |  |
| Curable resin | 1 | 10 |  |  |  | 10 |  |
|  | 2 |  |  |  |  |  |  |
|  | 3 |  | 5 | 10 |  |  |  |
|  | 4 |  |  |  | 10 | 10 | 6 |
| Curing aid | 1 |  |  |  |  |  |  |
|  | 2 |  |  |  |  |  | 10 |
|  | 3 | 0.2 | 0.2 | 0.2 | 0.3 | 0.2 | 0.2 |
| Solvent | MEK | 40 | 40 | 40 | 40 | 40 | 40 |
|  | Toluene | 360 | 360 | 360 | 360 | 360 | 360 |

(2) Liquid Crystal Polymer Film

A surface of a liquid crystal polymer film BIAC (registered trademark) BC50 (thickness: 50 μm, relative permittivity: 3.4, dielectric dissipation factor: 0.002) available from Ise Murata Manufacturing Co., Ltd., which was an insulating substrate, to be coated with an adhesive was subjected to a plasma treatment in advance in order to improve the adhesion between the liquid crystal polymer film and the adhesive. Specifically, as described in Japanese Unexamined Patent Application Publication No. 2007-302740, each liquid crystal polymer film was fixed between parallel electrodes in a parallel-plate electrode plasma reactor (electrode shape: round shape with diameter of 120 mm, inter-electrode distance: 50 mm, and chamber volume: 10.6 L), and the pressure was reduced to 0.06 Torr or less with a vacuum pump. Oxygen gas was introduced into the reactor, and the chamber internal pressure was set at 0.15 Torr by controlling the gas volume. Next, a high-frequency voltage of 13.56 MHz was applied across the electrodes to generate a plasma in a RIE process mode, whereby the surface of the film to be coated with an adhesive was subjected to a plasma treatment at an output of 0.3 W/cm² for 120 seconds.

(3) Lamination

Each adhesive composition was applied to the plasma-treated surface of the liquid crystal polymer film by using a bar coater such that the thickness of the adhesive layer after drying was 2.0 μm. The adhesive composition was then dried in an oven at 110° C. for 10 minutes.

As a copper foil, "F0-WS 18 μm" available from Furukawa Electric Co., Ltd. was used. A F0-WS series copper foil was a copper foil without a roughening treatment, which was normally applied to copper foil for copper clad laminates or circuit boards, and the substantial roughness height of the copper foil used was 0.2 μm.

The matte surface of the copper foil was attached to the adhesive layer on each liquid crystal polymer film, and heat-pressing was performed with a vacuum press machine under the conditions of a temperature of 180° C. and a pressure of 3 MPa for 30 minutes to produce a copper-clad laminate.

Test Example 1: Measurement of Dynamic Magnification and Loss Tangent of Adhesive Layer An adhesive was applied to the matte surface of a copper foil ("F0-WS 18 μm" available from Furukawa Electric Co., Ltd.) with a bar coater so as to obtain an adhesive thickness of 50 μm. The adhesive was then dried at 110° C. for 10 minutes to produce a multilayer body including the adhesive layer and the copper foil. Next, the matte surface of a copper foil ("F0-WS 18 μm" available from Furukawa Electric Co., Ltd.) was attached to the adhesive surface of the multilayer body, and vacuum-pressing was performed under the conditions of 180° C. and 3 MPa for 1 hour to provide a double-sided copper-clad laminate in which the adhesive layer was thermally cured. The obtained double-sided copper-clad laminate was immersed in a ferric chloride solution to completely remove the copper foils, and the resulting film was cut into ten adhesive films 10 cm×10 cm. The ten adhesive films were stacked on top of each other and subjected to pressure bonding with a roller to produce a test piece 10 cm×10 cm×500 μm in thickness. The test piece was set in a rotational rheometer ("Discovery HR-2" available from TA instruments), and the storage elastic modulus and the loss elastic modulus were measured at a strain of 2% in the strain dependent mode at 30° C. and a frequency of 1 Hz or 100 Hz. The dynamic magnification was calculated from Formula (I). The loss tangent was calculated from the measured values of the storage elastic modulus and the loss elastic modulus at a frequency of 1 Hz. The results are shown in Table 3.

Test Example 2: Measurement of Substantial Roughness Height of Copper Foil

A copper foil was cut into 5 mm squares and embedded in a room temperature curing epoxy resin ("SpeciFix-20" available from Strustrs). The resin was cured at 23° C. for 24 hours to produce a copper foil-containing cylindrical epoxy resin block with a diameter of 10 mm and a thickness of 10 mm. The block was cut perpendicular to the copper foil plane, and the cross section was precisely polished in an ion milling system ("IM4000PLUS" available from Hitachi High-Technologies Corporation) in the stage mode F5 under the condition of an acceleration voltage of 6 kV for 1 hour. The copper foil cross section exposed on the surface of the produced sample was observed under an electron microscope at a magnification of 5000 times. In accordance with JIS B0601-2001, the ten-point average roughness Rzjis of the copper foil within a sampling length of 10 μm in the planar direction of the copper foil was measured, and the obtained roughness was taken as a substantial roughness height. The substantial roughness height of the sample was measured at five points at 100 μm intervals in the width direction of the sample, and the mean of the substantial roughness height was obtained.

Test Example 3: Measurement of Relative Permittivity and Dielectric Dissipation Factor of Adhesive and Copper-Clad Laminate (1) Production of Adhesive Test Piece An adhesive was applied to the matte surface of a copper foil ("F0-WS 18 μm" available from Furukawa Electric Co., Ltd.) with a bar coater so as to obtain an adhesive thickness of 50 μm. The adhesive was then dried at 110° C. for 10 minutes to provide a multilayer body including the adhesive layer and the copper foil. Next, the matte surface of a copper foil ("F0-WS 18 μm" available from Furukawa Electric Co., Ltd.) was attached to the adhesive surface of the multilayer body, and vacuum-pressing was performed under the conditions of 180° C. and 3 MPa for 1 hour to provide a double-sided copper-clad laminate in which the adhesive layer was thermally cured. A sample obtained by immersing the obtained double-sided copper-clad laminate in a ferric chloride solution to completely remove the copper foils was cut into ten test pieces 10 cm×10 cm.

(2) Production of Liquid Crystal Polymer Film-Adhesive Layer Multilayer Body Test Piece Each double-sided copper-clad laminate was immersed in a ferric chloride solution to completely remove the copper foils and cut into ten test pieces 10 cm×10 cm. The dielectric resonator method is suitable for determination of dielectric characteristics in a high frequency region, but the dielectric characteristics of a laminate including metal foils cannot be determined by this method. In this experiment, the copper foils were thus removed from the copper-clad laminate to produce test pieces. Since the dielectric characteristics of metal-clad laminates depend on the dielectric characteristics of dielectrics, the dielectric characteristics of the liquid crystal polymer film-adhesive layer multilayer body obtained after removing the copper foils are assumed to be the same as the dielectric characteristics of the derivative of the copper-clad laminate.

(3) Measurement of Relative Permittivity and Dielectric Dissipation Factor by Dielectric Resonator Method The adhesive test piece and the liquid crystal polymer film-adhesive layer multilayer body test piece were dried in a circulation oven at 50° C. for 24 hours and cooled to room temperature in the standard environment described in JIS C6481. By using a network analyzer ("ENA E5071C" available from Agilent Technologies) and a split post dielectric resonator available from QWED company at a measurement frequency of 3.18 GHz, the resonant frequency of the resonator alone and the Q factor at the peak of the resonant frequency were first measured without inserting the test piece. Next, the test piece was inserted into the resonator, and the resonant frequency and the Q factor were measured with the test piece inserted. The relative permittivity was calculated from a difference between the resonant frequency of the resonator alone and the resonant frequency of the resonator with the test piece inserted. The dielectric dissipation factor was calculated from the difference in resonant frequency and a difference between the Q factor of the resonator alone and the Q factor of the resonator with the test piece inserted. The measurements were performed on ten test pieces, and the mean was obtained. The results are shown in Table 3.

Test Example 4: Confirmation of Leakage of Adhesive Layer

Each copper-clad laminate was cut into five test pieces 20 mm×20 mm. A through-hole with a diameter of 1.0 mm was made in a central portion of each test piece by using a YAG laser, and heat-pressing was performed with a heat press machine at 270° C. and 4 MPa for 15 minutes. The heat-pressed copper-clad laminate was immersed in a ferric chloride solution to remove the copper foils and dried in a hot air-oven at 80° C. for 1 hour. The maximum distance, from the through-hole wall surface, of the adhesive leaked into the through-hole in the surface from which the copper foil had been removed was measured by using a digital microscope ("VHX-500" available from KEYENCE Corporation) and taken as the amount of leakage. The amount of leakage was measured for five test pieces, and the mean was obtained. The results are shown in Table 3.

Test Example 5: Measurement of Adhesion Strength of Copper-Clad Laminate

The peel strength (unit: N/mm) when the copper foil was peeled off in the 180°-direction at a rate of 50 mm/min was measured by using a tensile tester ("AGS-H" available from Shimadzu Corporation) in accordance with JIS C6471. Specifically, each copper-clad laminate was cut into three test pieces 3 cm×10 cm. A masking tape 5 mm wide×10 cm was attached to each test piece in the longitudinal direction so as to extend over the copper foil-side center of the test piece. Each test piece was immersed in a ferric chloride solution to etch away an unnecessary portion of the copper foil. Subsequently, the masking tape was peeled off by washing the copper-clad laminate with water, and the copper-clad laminate was dried in a circulation oven at 80° C. for 1 hour to produce a test piece with a linear circuit pattern with a width of 5 mm. To avoid changes in peel angle caused as a result of bending of the test piece when the copper foil was peeled off from the test piece, the test piece was attached to a bakelite plate with a thickness of 2 mm for reinforcement by using a double-sided adhesive tape ("No. 5015" available from Nitto Denko Corporation). One end of the circuit pattern formed in the test piece was peeled off and clamped in a tensile tester. The copper foil was peeled off for a distance of 10 mm or more at a rate of 50 mm/min in the 180°-direction with respect to the test piece. The total mean of the strength for this distance was calculated as an adhesion strength. The adhesion strength was measured for three test pieces, and the mean was obtained. The results are shown in Table 3.

Test Example 6: Measurement of Thickness of Adhesive Layer

Under the same conditions as the conditions for producing the copper-clad laminate, a liquid crystal polymer film was coated with each resin composition such that the thickness of the adhesive layer after drying was 2.0 μm, followed by drying in an oven at 110° C. for 10 minutes. The obtained liquid crystal polymer film with the adhesive layer was cut into 50 mm squares, and the weight $W_1$ (g) was measured. Next, the film was immersed in toluene and heated at 50° C. for 10 hours to completely dissolve the adhesive and remove it. Subsequently, the film was dried at 80° C. for 1 hour, and the weight $W_2$ (g) after removing the adhesive was measured. The thickness of the adhesive layer was calculated from a difference in weight and the specific gravity S of each adhesive in accordance with the formula below. The thickness of the adhesive layer on each of three films formed of adjacent portions of the same liquid crystal polymer film was measured, and the mean of the thickness was obtained.

Adhesives thickness (μm)=$(W_1-W_2)/0.0025/S$

Since the adhesive layer is thin and light in weight, the weighing balance is preferably a weighing balance with an accuracy of 0.00001 g. In this measurement, a weighing balance "CPA225D" available from Sartorius, with a minimum unit of 0.00001 g, was used.

The specific gravity S was calculated in the following process. A 50 mm×50 mm adhesive test piece with an intended thickness of 50 μm was produced as in Test Example 3. The weight $W_3$ (g) and the thickness $T_1$ (μm) of the test piece were measured, and the partial adhesive specific gravity was calculated in accordance with the formula below. The partial specific gravity was measured for each of three test pieces formed of adjacent portions of the same liquid crystal polymer film, and the mean of the partial specific gravity was taken as the specific gravity S.

Partial adhesive specific gravity=$W_3/T_1/0.0025$

A weighing balance "CPA225D" available from Sartorius was used for weight measurement, and a digital thickness gage "SMD-565" available from TECLOCK Co., Ltd. was used for thickness. The results are shown in Table 3.

thus equivalent to or better than the dielectric characteristics of the liquid crystal polymer film used.

Examples 6 to 8, Comparative Examples 7, 8:
Examination of Adhesive Layer Thickness Copper-clad laminates having the same adhesive layer composition as the copper-clad laminate of Example 1 but being different only in adhesive layer thickness as shown in Table 4 were produced and measured for the adhesion strength of the copper foil and the amount of adhesive leakage in the same manner as for Example 1. The results are shown in Table 4.

TABLE 4

|  | Example 1 | Example 6 | Example 7 | Example 8 | Comparative Example 7 | Comparative Example 8 |
| --- | --- | --- | --- | --- | --- | --- |
| Adhesive layer thickness (μm) | 2.0 | 0.5 | 1.0 | 4.0 | 0.4 | 7.0 |

TABLE 3

| | | Example 1 | Example 2 | Example 3 | Example 4 | Example 5 | Comparative Example 1 | Comparative Example 2 | Comparative Example 3 | Comparative Example 4 | Comparative Example 5 | Comparative Example 6 |
| --- | --- | --- | --- | --- | --- | --- | --- | --- | --- | --- | --- | --- |
| Characteristics of adhesive layer | Adhesive layer thickness (μm) | 1.9 | 2.0 | 2.0 | 2.1 | 2.0 | 2.1 | 2.0 | 2.0 | 1.9 | 2.0 | 2.1 |
| | Relative permittivity | 2.3 | 2.4 | 2.4 | 2.3 | 2.4 | 2.3 | 2.3 | 2.3 | 2.3 | 2.3 | 2.4 |
| | Dielectric dissipation factor | 0.002 | 0.003 | 0.004 | 0.003 | 0.004 | 0.003 | 0.002 | 0.003 | 0.004 | 0.003 | 0.003 |
| | A: Storage elastic modulus 100 Hz, 2% (MPa) | 40.2 | 59.1 | 99.4 | 13.0 | 30.1 | 14.8 | 35.4 | 30.4 | 39.1 | 28.9 | 51.5 |
| | B: Storage elastic modulus 1 Hz, 2% (MPa) | 34.7 | 43.8 | 43.3 | 6.67 | 15.8 | 58.3 | 73.3 | 97.9 | 63.2 | 25.1 | 18.5 |
| | Dynamic magnification (A/B) | 1.16 | 1.35 | 2.29 | 1.95 | 1.91 | 0.25 | 0.48 | 0.31 | 0.62 | 1.15 | 2.78 |
| | C: Storage elastic modulus 1 Hz, 0.06% (MPa) | 113 | 102 | 87.6 | 103 | 70.6 | 158 | 111 | 157 | 108 | 286 | 38.1 |
| | D: Loss elastic modulus 1 Hz, 0.06% (MPa) | 11.5 | 15.5 | 13.9 | 13.0 | 8.20 | 16.4 | 10.8 | 19.6 | 21.0 | 4.72 | 6.93 |
| | Loss tangent (C/D) | 0.10 | 0.10 | 0.12 | 0.097 | 0.13 | 0.15 | 0.16 | 0.13 | 0.11 | 0.19 | 0.17 |
| Characteristics of copper-clad laminate | Relative permittivity | 3.3 | 3.3 | 3.3 | 3.3 | 3.3 | 3.3 | 3.3 | 3.3 | 3.3 | 3.3 | 3.4 |
| | Dielectric dissipation factor | 0.002 | 0.002 | 0.002 | 0.002 | 0.002 | 0.002 | 0.002 | 0.002 | 0.002 | 0.002 | 0.002 |
| | Adhesion strength (N/mm) | 0.50 | 0.51 | 0.61 | 0.52 | 0.50 | 0.46 | 0.47 | 0.44 | 0.28 | 0.29 | 0.38 |
| | Amount of leakage (μm) | 10 | 20 | 20 | 10 | 10 | 10 | 20 | 10 | 10 | 30 | 20 |

As shown in the results in Table 3, when the adhesive was thinned to reduce the leakage of the adhesive into vias despite the use of a smooth copper foil for high-frequency characteristics and when the dynamic magnification of the adhesive layer was less than 1.15 or the loss tangent was more than 0.16, the adhesion strength of the copper foil in the copper-clad laminate was inadequate. When the dynamic magnification was 1.15 or more and the loss tangent was 0.16 or less, there was a tendency to clearly improve the adhesion strength of the copper foil in the copper-clad laminate. Since the same liquid crystal polymer film was used and adhesives having good dielectric characteristics were used in Examples and Comparative Examples, the dielectric characteristics of the copper-clad laminates were TABLE 4-continued

|  | Example 1 | Example 6 | Example 7 | Example 8 | Comparative Example 7 | Comparative Example 8 |
| --- | --- | --- | --- | --- | --- | --- |
| Adhesion strength (N/mm) | 0.50 | 0.50 | 0.50 | 0.55 | 0.38 | 0.60 |
| Amount of leakage (μm) | 10 | 5 | 5 | 20 | 5 | 60 |

The results in Table 4 show that the adhesion strength of the copper foil was obviously low in a copper-clad laminate (Comparative Example 7) in which the adhesive layer had an excessively small thickness of 0.4 μm, and the amount of adhesive leakage in heat-pressing was large in a copper-clad laminate (Comparative Example 8) in which the adhesive layer had a thickness of 7.0 μm. In the copper-clad laminate according to the present invention in which the adhesive layer had a thickness in the range of 0.5 μm or more and 4.0 μm or less, the adhesion strength of the copper foil was high, and the amount of adhesive leakage was small.

REFERENCE SIGNS LIST

1: Liquid crystal polymer film
2: Adhesive layer
3: Circuit
4: Via
5: Multilayer circuit board

The invention claimed is:

1. A metal-clad laminate comprising:
a liquid crystal polymer film;
an adhesive layer disposed on the liquid crystal polymer film, with the adhesive layer having:
a thickness of 0.5 μm or more and 4.0 μm or less,
a dynamic magnification of at least 1.15, and
a loss tangent of 0.16 or less at a strain of 0.06% under periodic strain at 1 Hz, and
a metal foil disposed on the adhesive layer and having a surface in contact with the adhesive layer having roughness height of 0.4 μm or less.

2. The metal-clad laminate according to claim 1, wherein the adhesive layer has a relative permittivity of 3.0 or less and a dielectric dissipation factor of 0.008 or less.

3. The metal-clad laminate according to claim 1, wherein the adhesive layer comprises a main agent and a curable resin.

4. The metal-clad laminate according to claim 3, wherein the main agent is a carboxy group-containing styrene-based elastomer.

5. The metal-clad laminate according to claim 4, wherein the curable resin is an epoxy resin.

6. The metal-clad laminate according to claim 1, wherein the liquid crystal polymer film has a thickness of 5 μm or more and 130 μm or less.

7. The metal-clad laminate according to claim 1, wherein the metal foil has a thickness of 5 μm or more and 40 μm or less.

8. A circuit board comprising:
a metal-clad laminate that includes;
a liquid crystal polymer film;
an adhesive layer disposed on the liquid crystal polymer film, with the adhesive layer having:
a thickness of 0.5 μm or more and 4.0 μm or less,
a dynamic magnification of at least 1.15, and
a loss tangent of 0.16 or less at a strain of 0.06% under periodic strain at 1 Hz, and
a metal foil disposed on the adhesive layer and having a surface in contact with the adhesive layer having roughness height of 0.4 μm or less; and
a circuit disposed in the metal foil of the metal-clad laminate.

9. A multilayer circuit board comprising two or more of the circuit boards according to claim 8, wherein the circuit boards are stacked on top of each other.

10. The multilayer circuit board according to claim 9, comprising at least one via connecting the stacked circuits boards.

11. The multilayer circuit board according to claim 8, further comprising an electronic device that is mounted on each circuit.

12. The multilayer circuit board according to claim 9, further comprising an electronic device that is mounted on each circuit.

13. The multilayer circuit board according to claim 8, wherein the adhesive layer has a relative permittivity of 3.0 or less and a dielectric dissipation factor of 0.008 or less.

14. The multilayer circuit board according to claim 8, wherein the adhesive layer comprises a main agent and a curable resin, and the main agent is a carboxy group-containing styrene-based elastomer.

15. The multilayer circuit board according to claim 14, wherein the curable resin is an epoxy resin.

16. The multilayer circuit board according to claim 8, wherein the liquid crystal polymer film has a thickness of 5 μm or more and 130 μm or less.

17. The multilayer circuit board according to claim 8, wherein the metal foil has a thickness of 5 μm or more and 40 μm or less.

18. An electronic component comprising:
a multilayer circuit board, with each circuit board including:
a metal-clad laminate that includes a liquid crystal polymer film, an adhesive layer, and a metal foil stacked on the adhesive layer,
wherein the adhesive layer includes a thickness of 0.5 μm or more and 4.0 μm or less, a dynamic magnification of at least 1.15, and a loss tangent of 0.16 or less at a strain of 0.06% under periodic strain at 1 Hz,
wherein the metal foil has a surface in contact with the adhesive layer with roughness height of 0.4 μm or less, and
wherein a circuit is disposed in the metal foil of the metal-clad laminate; and
a mother board with the multilayer circuit board mounted on the mother board.

19. The electronic component according to claim 18, wherein the multilayer circuit board comprises at least one via connecting the stacked circuits boards.

20. The electronic component according to claim 18, wherein an electronic device is mounted on each circuit of each circuit board in the multilayer circuit board.

* * * * *